(12) United States Patent
Im

(10) Patent No.: US 9,768,242 B2
(45) Date of Patent: Sep. 19, 2017

(54) ORGANIC LIGHT EMITTING DIODE DISPLAY

(71) Applicant: Samsung Display Co., Ltd., Yongin-si, Gyeonggi-do (KR)

(72) Inventor: Jung Jun Im, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 14/957,460

(22) Filed: Dec. 2, 2015

(65) Prior Publication Data

US 2016/0225838 A1 Aug. 4, 2016

(30) Foreign Application Priority Data

Feb. 2, 2015 (KR) .................. 10-2015-0016348

(51) Int. Cl.
*H01L 27/12* (2006.01)
*H01L 27/32* (2006.01)
*G09G 3/3233* (2016.01)

(52) U.S. Cl.
CPC ....... *H01L 27/3276* (2013.01); *G09G 3/3233* (2013.01); *G09G 2300/0452* (2013.01); *G09G 2300/0814* (2013.01); *G09G 2300/0861* (2013.01); *G09G 2310/0262* (2013.01); *G09G 2320/0238* (2013.01); *H01L 27/124* (2013.01); *H01L 27/1255* (2013.01)

(58) Field of Classification Search
CPC  H01L 27/3276; H01L 27/1255; H01L 27/124
See application file for complete search history.

(56) References Cited

U.S. PATENT DOCUMENTS

2012/0001896 A1\* 1/2012 Han .................... G09G 3/3233
                                                                345/214

FOREIGN PATENT DOCUMENTS

| KR | 10-2009-0046536 A | 5/2009 |
|---|---|---|
| KR | 10-2013-0091136 A | 8/2013 |
| KR | 10-2013-0106466 A | 9/2013 |
| KR | 10-2014-0018623 A | 2/2014 |

\* cited by examiner

*Primary Examiner* — Douglas Menz
(74) *Attorney, Agent, or Firm* — Lewis Roca Rothgerber Christie LLP

(57) ABSTRACT

An organic light emitting diode display includes: a plurality of pixels including a first pixel, a second pixel, and a third pixel connected to the plurality of scan lines and the plurality of data lines, wherein each pixel includes a switching transistor connected to the scan line and the data line, a driving transistor connected to the switching transistor, an organic light emitting diode connected to the driving transistor, and a light emission control transistor between the driving transistor and the organic light emitting diode and configured to be turned on by the light emission control signal, and at least one pixel from among the first pixel, the second pixel, and the third pixel further includes a bypass transistor configured to bypass a portion of a driving current transmitted by the driving transistor.

15 Claims, 8 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0016348 filed in the Korean Intellectual Property Office on Feb. 2, 2015, the entire contents of which are incorporated herein by reference.

BACKGROUND

1. Field

The present disclosure relates to an organic light emitting diode display.

2. Description of the Related Art

An organic light emitting diode display includes two electrodes and an organic light emitting layer positioned therebetween. Electrons injected from a cathode electrode and holes injected from an anode electrode are combined with each other in the organic light emitting layer to form excitons. Light is emitted while the excitons discharge energy.

The organic light emitting diode display includes a plurality of pixels each including an organic light emitting diode formed of the cathode, the anode, and the organic light emitting layer. A plurality of thin film transistors and capacitors for driving the organic light emitting diode are formed in each pixel. The plurality of thin film transistors includes a switching thin film transistor and a driving thin film transistor.

Particularly, an organic emission layer having high efficiency is used to reduce power consumption, however, in this case, a black luminance in a black image may increase. To solve this problem, a bypass transistor is formed to realize a correct black luminance image.

To form the bypass transistor, a space to form a separate bypass control line and the bypass transistor is used in the pixel such that the bypass transistor is difficult to apply to high resolution structure and a margin is decreased, thereby increasing defects and reducing yield.

The above information disclosed in this Background section is only for enhancement of understanding of the background of the disclosure and therefore it may contain information that does not form prior art.

SUMMARY

The present disclosure relates to an organic light emitting diode display capable of being applied to a high resolution structure and improving yield.

According to an aspect of the an embodiment of the present invention, an organic light emitting diode display includes: a substrate; a plurality of scan lines and a plurality of light emission control lines on the substrate, and configured to transmit a scan signal and a light emission control signal, respectively; a plurality of data lines and a plurality of driving voltage lines crossing the scan lines and the light emission control lines, and configured to transmit a data voltage and a driving voltage, respectively; and a plurality of pixels including a first pixel, a second pixel, and a third pixel, and connected to the plurality of scan lines and the plurality of data lines, wherein each of the pixels includes: a switching transistor connected to a corresponding one of the scan lines and a corresponding one of the data lines; a driving transistor connected to the switching transistor; an organic light emitting diode connected to the driving transistor; and a light emission control transistor between the driving transistor and the organic light emitting diode, and configured to be turned on by the light emission control signal, wherein at least one pixel from among the first pixel, the second pixel, and the third pixel, further comprises a bypass transistor configured to bypass a portion of a driving current transmitted by the driving transistor.

The organic light emitting diode display may further include: a plurality of previous scan lines and a plurality of bypass control lines on the substrate, and configured to transmit a previous scan signal and a bypass control signal, respectively; and an initialization transistor configured to be turned on according to the previous scan signal to transmit an initialization voltage to a driving gate electrode of the driving transistor, wherein the bypass transistor is between the initialization transistor and the light emission control transistor, and is configured to be turned on by the bypass control signal.

The bypass transistor may include: a bypass channel on the substrate; a bypass gate electrode overlapping the bypass channel; and a bypass source electrode and a bypass drain electrode at respective sides of the bypass channel, wherein the bypass source electrode is directly connected to a light emission control drain electrode of the light emission control transistor, and the bypass drain electrode is directly connected to an initialization source electrode of the initialization transistor of an adjacent one of the pixels.

The bypass gate electrode may be a portion overlapping the bypass channel of a corresponding one of the bypass control lines.

The bypass transistor may be one pixel having a largest effect on a black luminance, from among the first pixel, the second pixel, and the third pixel.

The first pixel, the second pixel, and the third pixel, may include a red pixel, a green pixel, and a blue pixel, respectively, and the bypass transistor is in the green pixel.

The light emission control transistor and the initialization transistor of the red pixel may be separated from each other, and the light emission control transistor and the initialization transistor of the blue pixel may be separated from each other.

The light emission control drain electrode of the light emission control transistor of the red pixel and the initialization source electrode of the initialization transistor may be separated from each other, and the light emission control drain electrode of the light emission control transistor of the blue pixel and the initialization source electrode of the initialization transistor may be separated from each other.

The bypass transistor may be in two pixels having a largest effect on a black luminance, from among the first pixel, the second pixel, and the third pixel.

The first pixel, the second pixel, and the third pixel, may include a red pixel, a green pixel, and a blue pixel, respectively, and the bypass transistor may be in the green pixel and the red pixel.

The light emission control transistor and the initialization transistor of the blue pixel may be separated from each other.

The light emission control drain electrode of the light emission control transistor of the blue pixel and the initialization source electrode of the initialization transistor may be separated from each other.

The driving transistor may include: a driving channel on the substrate, a driving gate electrode overlapping the driving channel, and a driving source electrode and a driving drain electrode at respective sides of the driving channel, wherein the driving channel is curved on a plane.

The organic light emitting diode display may further include: a storage capacitor including: a first storage electrode at a same layer as the corresponding one of the scan lines and overlapping the driving channel; and a second storage electrode overlapping the first storage electrode and located on the first storage electrode, wherein the first storage electrode is a driving gate electrode of the driving transistor.

The organic light emitting diode includes: a pixel electrode electrically connected to the driving transistor, an organic emission layer on the pixel electrode, and a common electrode on the organic emission layer.

According to the present disclosure, by only forming the bypass transistor in the pixel having the largest effect on the black luminance, the correct black luminance image may be realized, thereby improving the contrast ratio. Also, by omitting the bypass transistor in the pixel having the smallest effect on the black luminance, the space may be maximally ensured in the pixel to be applied to a high resolution structure, and the margin may be maximally ensured, thereby improving the yield.

DETAILED DESCRIPTION

Figure 1:
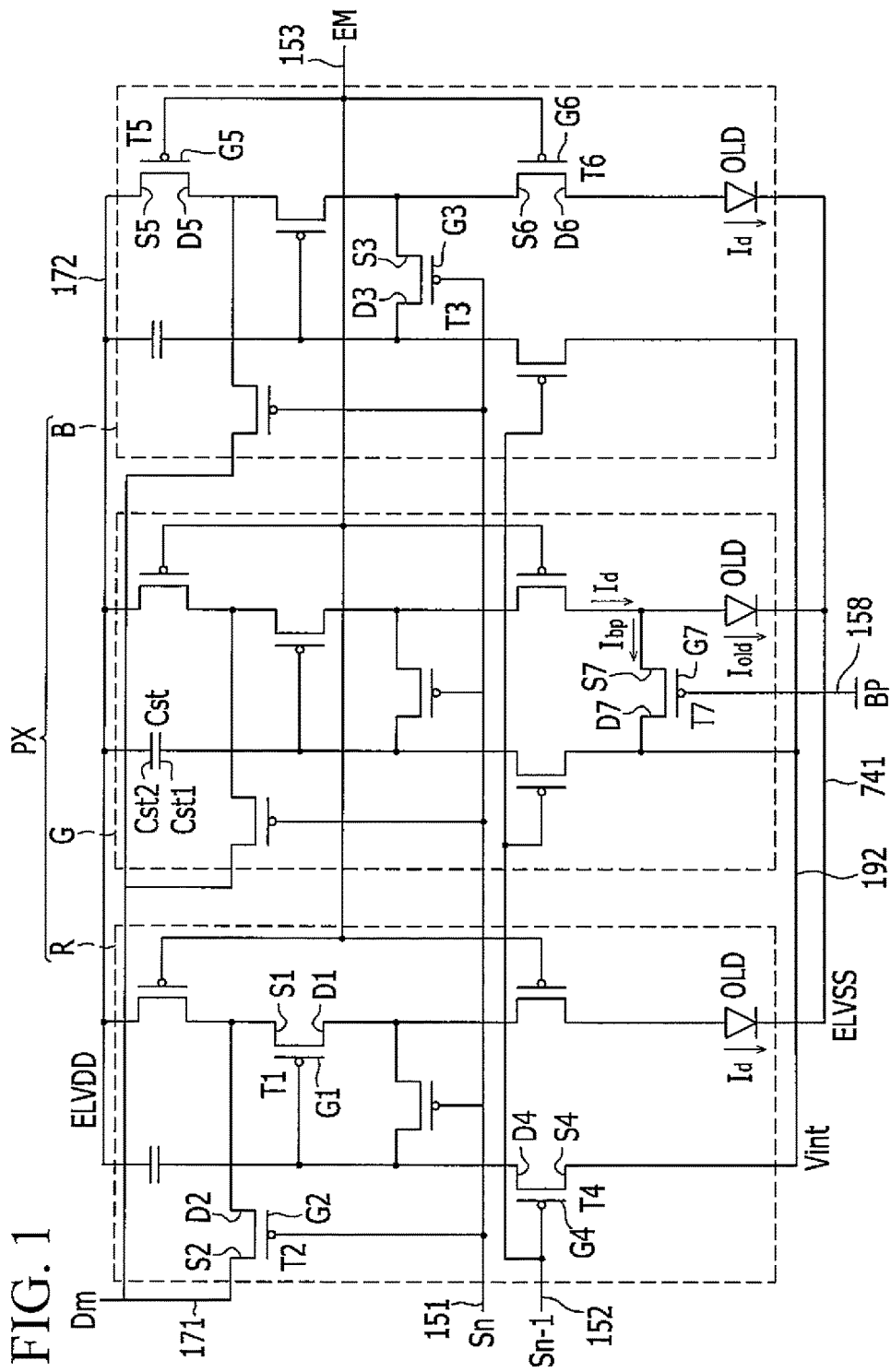
FIG. 1 is an equivalent circuit diagram of a red pixel, a green pixel, and a blue pixel connected to a plurality of signal lines of an organic light emitting diode display according to an exemplary embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing devices may be combined or integrated into a single computing device, or the functionality of a particular computing device may be distributed across one or more other computing devices without departing from the spirit and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Further, throughout the specification, the term "according to a plane" means a case where a target portion is viewed from above, and the term "according to a cross-section" means a case where a cross-section is taken by vertically cutting a target portion when viewed from the side.

The present disclosure is not limited to a number of thin film transistors (TFT) and capacitors shown in the accompanying drawings. In the organic light emitting diode display, each pixel may be provided with a plurality of transistors and at least one capacitor, and may be formed to have various structures by further forming additional wires and/or omitting existing wires. In this case, the pixel is a minimum unit (or a smallest unit) for displaying an image, and the organic light emitting diode display displays an image through the plurality of pixels.

An organic light emitting diode display according to an exemplary embodiment of the present disclosure will be described with reference to the accompanying drawings.

FIG. 1 is an equivalent circuit diagram of a red pixel, a green pixel, and a blue pixel connected to a plurality of signal lines of an organic light emitting diode display according to an exemplary embodiment of the present disclosure.

As shown in FIG. 1, the organic light emitting diode display according to an exemplary embodiment of the present disclosure includes a plurality of signal lines 151, 152, 153, 158, 171, 172, and 192 and a plurality of pixels PX arranged in a matrix and connected to a plurality of signal lines. The plurality of pixels PX include a red pixel (R), a green pixel (G), and a blue pixel (B).

The green pixel (G) includes a plurality of transistors T1, T2, T3, T4, T5, T6, and T7 connected to a plurality of signal lines 151, 152, 153, 158, 171, 172, and 192, a storage capacitor Cst, and an organic light emitting diode OLD. The red pixel (R) and the blue pixel (B) include a plurality of transistors T1, T2, T3, T4, T5, and T6 connected to a plurality of signal lines 151, 152, 153, 171, 172, and 192, a storage capacitor Cst, and an organic light emitting diode OLD.

The transistors T1, T2, T3, T4, T5, T6, and T7 formed in the green pixel (G) include a driving transistor T1, a switching transistor T2, a compensation transistor T3, an initialization transistor T4, an operation control transistor T5, a light emission control transistor T6, and a bypass transistor T7. The bypass transistor T7 is not formed in the red pixel (R) and the blue pixel (B).

The signal lines 151, 152, 153, 158, 171, 172, and 192 include a scan line 151 for transferring a scan signal Sn, a previous scan line 152 for transferring a previous scan signal Sn−1 to the initialization transistor T4, a light emission control line 153 for transferring a light emission control signal EM to the operation control transistor T5 and the light emission control transistor T6, a bypass control line 158 for transferring a bypass signal BP to the bypass transistor T7, a data line 171 crossing the scan line 151 and for transferring a data signal Dm, a driving voltage line 172 for transferring a driving voltage ELVDD and formed to be substantially parallel with the data line 171, and an initialization voltage line 192 for transferring an initialization voltage Vint for initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. The switching transistor T2 is turned on according to the scan signal Sn received through the scan line 151 to perform a switching operation of transferring the data signal Dm transferred to the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLD via the light emission control transistor T6, and a drain electrode D3 of the compensation transistor T3 is connected with one end Cst1 of the storage capacitor Cst, the drain electrode D4 of the initialization transistor T4, and the gate electrode G1 of the driving transistor T1, together. The compensation transistor T3 is turned on according to the scan signal Sn received through the scan line 151 to connect the gate electrode G1 and the drain electrode D1 of the driving transistor T1 to diode-connect the driving transistor T1.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal Sn−1 received through the previous scan line 152 to transfer the initialization voltage Vint to the gate electrode G1 of the driving transistor T1 and then perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected to the light emission control line 153, the source electrode S6 of the first light emission control transistor T6 is connected to the drain electrode D1 of the driving transistor T1 and the source electrode S3 of the compensation transistor T3, and the drain electrode D6 of the first light emission control transistor T6 is electrically connected to the anode of the organic light emitting diode OLD. The operation control transistor T5 and the first light emission control transistor T6 are simultaneously turned on according to the light emission control signal EM transmitted to the light emission control line 153 such that the driving voltage ELVDD is compensated through the diode-connected driving transistor T1 and is transmitted to the organic light emitting diode OLD.

A gate electrode G7 of the thin film bypass transistor T7 formed in the green pixel (G) is connected to the bypass control line 158, a source electrode S7 of the bypass thin film transistor T7 is connected to the drain electrode D6 of the light emission control thin film transistor T6 and the anode of the organic light emitting diode OLD together, and a drain electrode D7 of the bypass thin film transistor T7 is connected to the initialization voltage line 192 and the source electrode S4 of the initialization thin film transistor T4 together.

The other end Cst2 of the storage capacitor Cst is connected with the driving voltage line 172, and a cathode of the organic light emitting diode OLD is connected with a common voltage line 741 for transferring a common voltage ELVSS.

Hereinafter, a detailed operation process of the green pixel of the organic light emitting diode display according to the exemplary embodiment of the present disclosure will be described in detail with reference to FIG. 2. The operation of the red pixel and the blue pixel is the same or substantially the same as most of the operation process of the green pixel except for the bypass transistor such that the detailed description thereof is omitted.

Figure 2:
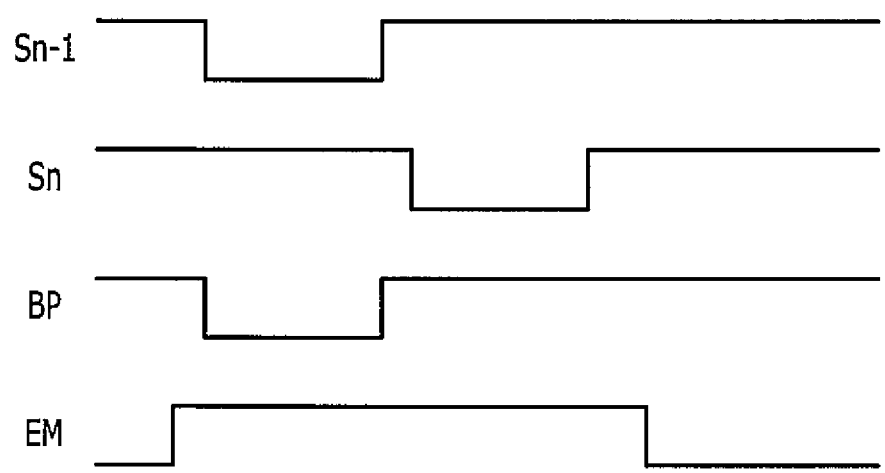
FIG. 2 is a timing diagram of signals applied to a green pixel of an organic light emitting diode display according to an exemplary embodiment of the present disclosure.

FIG. 2 is a timing diagram of signals applied to a green pixel of an organic light emitting diode display according to an exemplary embodiment of the present disclosure.

As shown in FIG. 2, first, for an initializing period, the previous scan signal Sn−1 having a low level is supplied through the previous scan line 152. Then, the initializing thin film transistor T4 is turned on in response to the previous scan signal Sn−1 having the low level, the initial voltage Vint is connected to the gate electrode G1 of the driving transistor T1 from the initialization voltage line 192 through the initializing thin film transistor T4, and then the driving thin film transistor T1 is initialized by the initialization voltage Vint.

Thereafter, for a data programming period, the scan signal Sn having a low level is supplied through the scan line 151. Then, the switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

A compensation voltage Dm+Vth (where Vth is a negative (−) value) reduced by a threshold voltage Vth of the driving thin film transistor T1 from a data signal Dm supplied from the data line 171 is applied to the gate electrode G1 of the driving thin film transistor T1. That is, the gate voltage Vg applied to the gate electrode G1 of the driving transistor T1 becomes the compensation voltage (Dm+Vth).

The driving voltage ELVDD and the compensation voltage (Dm+Vth) are applied to both terminals of the storage capacitor Cst, and a charge corresponding to a voltage difference between both terminals is stored in the storage capacitor Cst.

Next, during the light emission period, the light emission control signal EM supplied from the light emission control line 153 is changed from the high level to the low level. The operation control transistor T5 and the light emission control transistor T6 are turned on by the light emission control signal EM of the low level during the light emission period.

A driving current Id is generated according to the voltage difference between the gate voltage of the gate electrode G1 of the driving transistor T1 and the driving voltage ELVDD, and the driving current Id is supplied to the organic light emitting diode OLD through the light emission control transistor T6. The gate-source voltage Vgs of the driving thin film transistor T1 is maintained as (Dm+Vth)-ELVDD by the storage capacitor Cst for the light emission period. According to a current-voltage relationship of the driving thin film transistor T1, the driving current Id is proportional to the square $(Dm-ELVDD)^2$ of a value obtained by subtracting the threshold voltage from the source-gate voltage. Accordingly, the driving current Id is determined regardless of the threshold voltage Vth of the driving thin film transistor T1.

In this case, the bypass transistor T7 is transmitted with the bypass signal BP from the bypass control line 158 and the portion of the driving current Id is discharged as the bypass current Ibp through the bypass transistor T7.

When a minimum current of the driving transistor T1 for displaying the black image flows as the driving current, if the organic light emitting diode (OLD) is also emitted, the black image is not normally displayed. Accordingly, the bypass transistor T7 of the organic light emitting diode display according to an exemplary embodiment of the present disclosure may disperse the portion of the minimum (or the smallest) current of the driving transistor T1 as the bypass current Ibp through the current path adjacent the current path of the organic light emitting diode. Here, the minimum (or the smallest) current of the driving transistor T1 means the current of the driving transistor T1 when the driving transistor T1 is turned off since the gate-source voltage Vgs of the driving transistor T1 is less than the threshold voltage Vth. The minimum (or the smallest) driving current (for example, a current of 10 pA or less) in which the driving transistor T1 is turned off is transferred to the organic light emitting diode OLD to emit light such that the organic light emitting diode OLD is expressed as an image with black luminance. When the minimum (or the smallest) driving current for expressing the black image flows, an influence on a bypass transfer of the bypass current Ibp is large, but when a large driving current for expressing an image, such as a normal image or a white image, flows, there may be little influence on the bypass current Ibp. Accordingly, when the driving current for displaying the black image flows, the light emission current load of the organic light emitting diode OLD, which is reduced by the current amount of the bypass current Ibp which flows out from the driving current Id through the bypass transistor T7, has a minimum (or smallest) current amount as a level which may be equivalent to exactly the current amount for expressing the black image. Therefore, a black luminance image is exactly implemented by using the bypass transistor T7, thereby improving a contrast ratio. In FIG. 2, the bypass signal BP is the same or substantially the same as the previous scan signal Sn−1, but is not limited thereto.

Next, an arrangement structure of the plurality of pixels of the organic light emitting diode display shown in FIG. 1 and FIG. 2 will be described with reference to FIG. 3.

Figure 3:
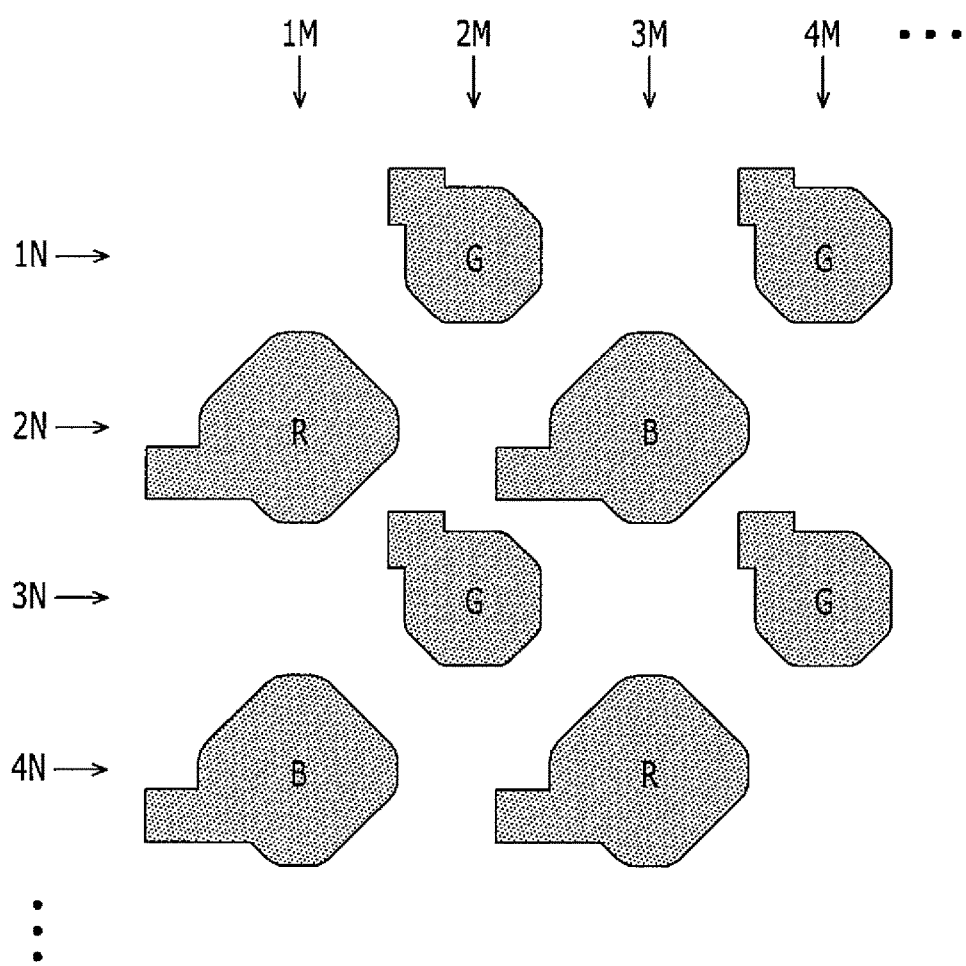
FIG. 3 is a schematic layout view of a plurality of pixels of an organic light emitting diode display according to an exemplary embodiment of the present disclosure.

FIG. 3 is a schematic layout view of a plurality of pixels of an organic light emitting diode display according to an exemplary embodiment of the present disclosure.

As shown in FIG. 3, a plurality of green pixels G corresponding to a second pixel are separated by a predetermined or set interval in a first row 1N, a red pixel R corresponding to a first pixel and a blue pixel B corresponding to a third pixel are alternately arranged in a second row 2N adjacent thereto, a plurality of green pixels G are separated by a predetermined or set interval in a third row 3N adjacent thereto, a blue pixel B and a red pixel R are alternately arranged in a fourth row 4N adjacent thereto, and the pixel arrangement is repeated to a N-th row. In this case, the blue pixel B and the red pixel R are formed to be larger than the green pixel G.

In this case, the plurality of green pixels G arranged in the first row 1N and the plurality of red pixels R and blue pixels B arranged in the second row 2N are alternately arranged. Accordingly, the red pixel R and the blue pixel B are alternately arranged in a first column 1M, the plurality of green pixels G are spaced apart from each other by a predetermined or set interval in an adjacent second column 2M, the blue pixel B and the red pixel R are alternately arranged in an adjacent third column 3M, and the plurality of green pixels G are spaced apart from each other by a predetermined or set interval in an adjacent fourth column 4M, and the arrangement of the pixels is repeated up to an M-th column.

The aforementioned pixel arrangement pattern or structure is referred to as a pentile matrix, and high definition with the small number of pixels may be implemented by adopting, rendering, driving, and/or sharing adjacent pixels to express colors.

A detailed structure of the organic light emitting diode display according to the pixel arrangement illustrated in FIG. 3 will be described in detail with reference to FIG. 4, FIG. 5, FIG. 6, and FIG. 7.

Figure 4:
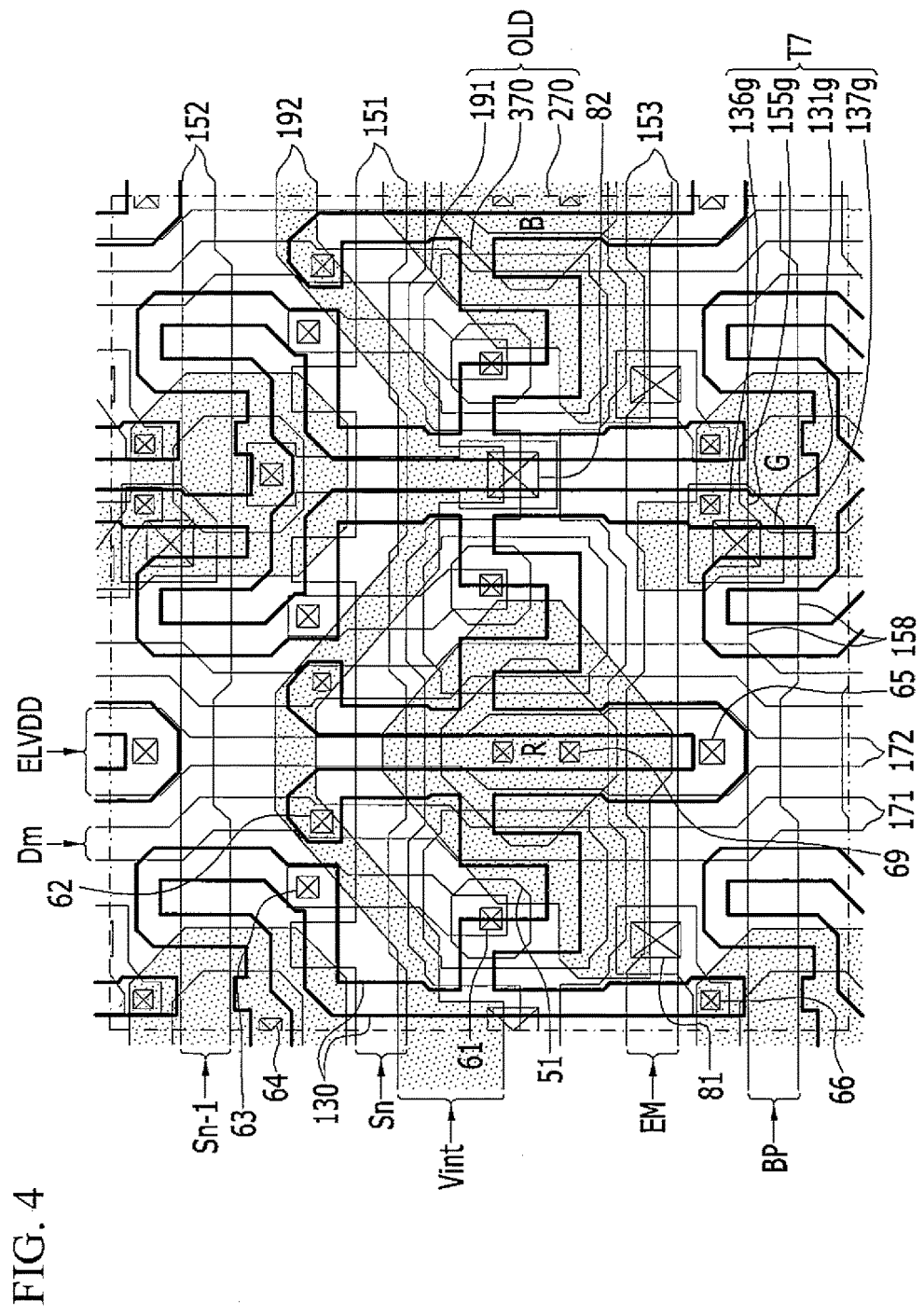
FIG. 4 is a schematic layout view of a transistor and a capacitor forming a red pixel, a green pixel, and a blue pixel of an organic light emitting diode display according to an exemplary embodiment of the present disclosure.
Figure 5:
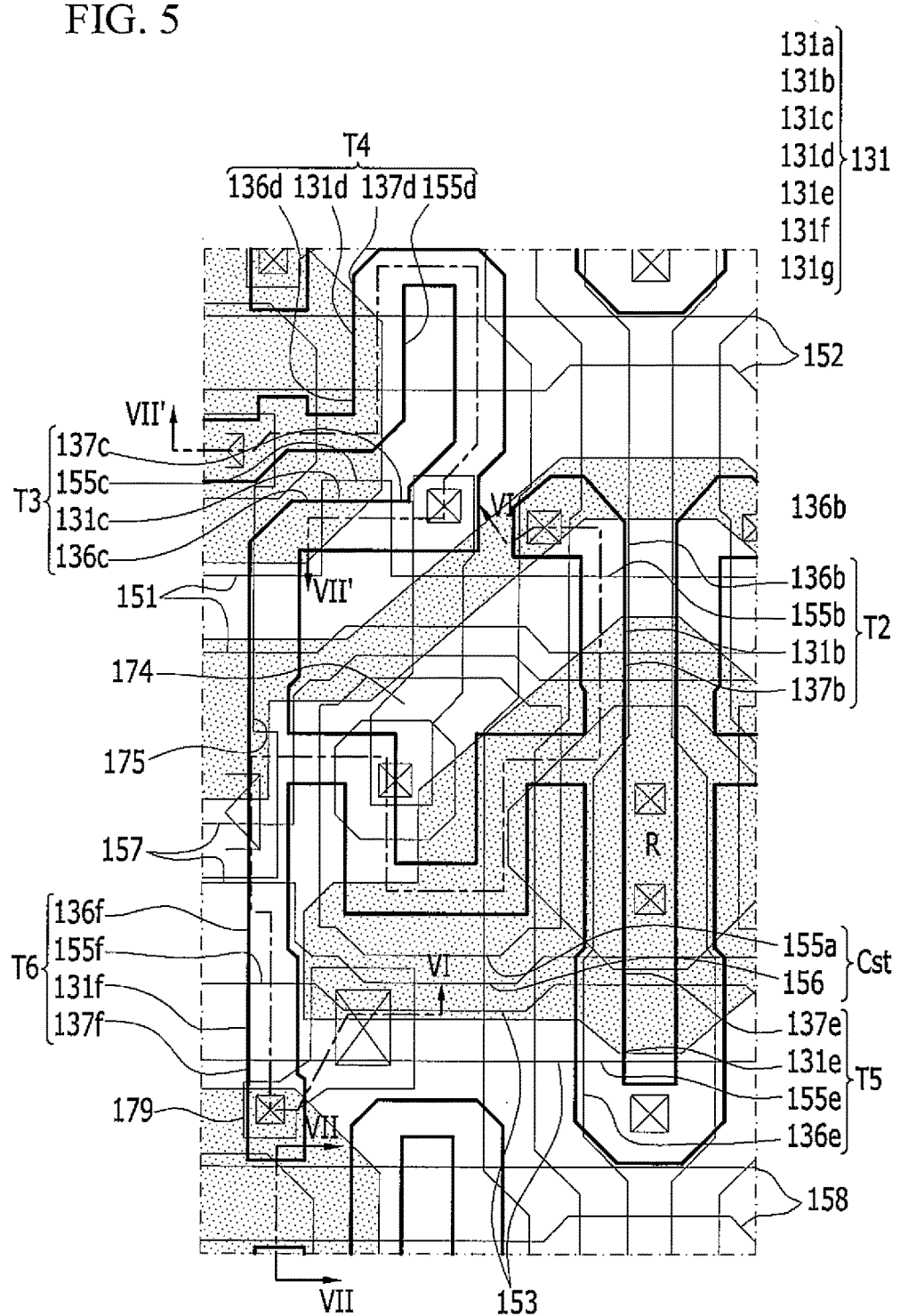
FIG. 5 is a detailed layout view of the red pixel of FIG. 4.
Figure 6:
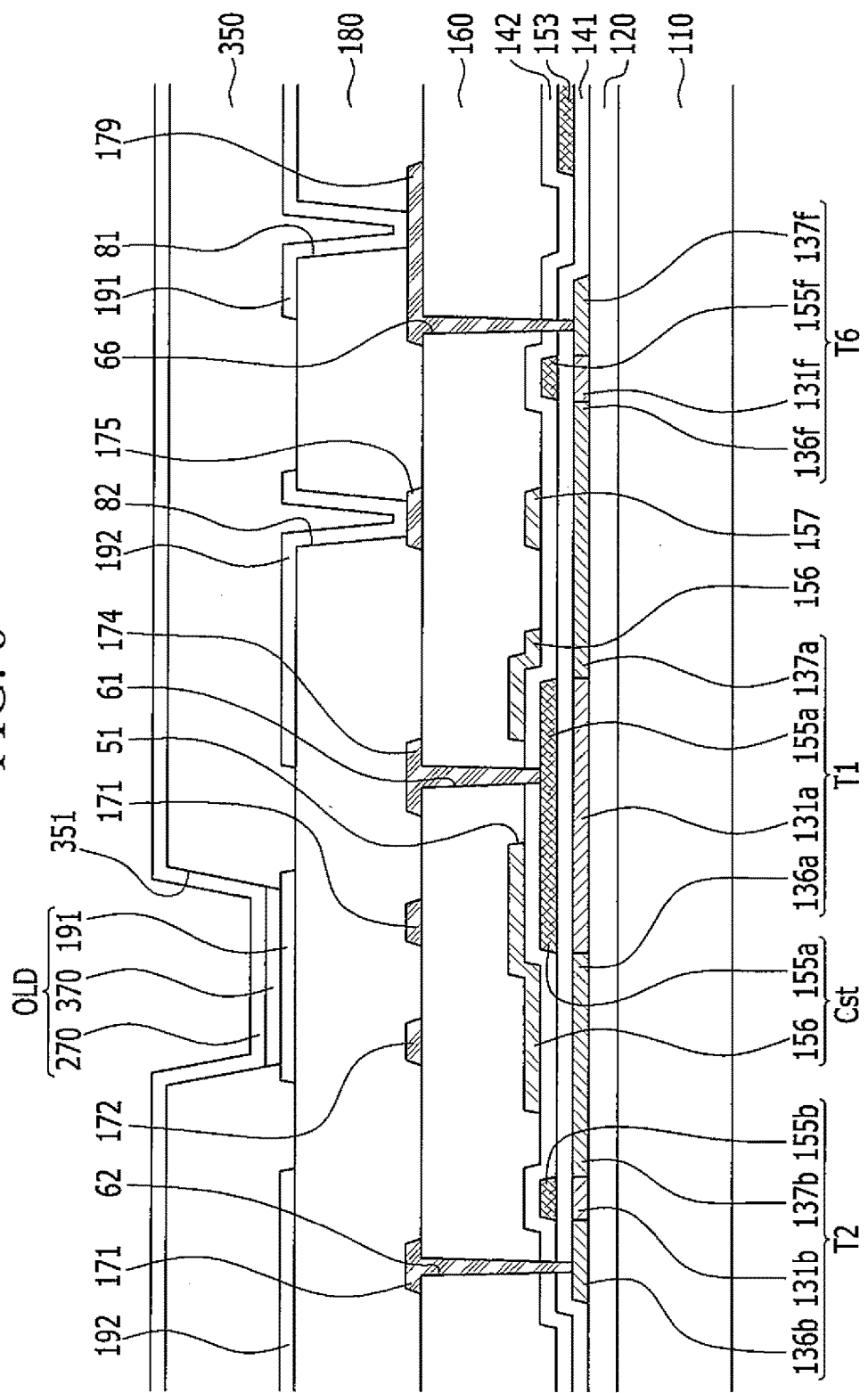
FIG. 6 is a cross-sectional view of the organic light emitting diode display of FIG. 5 taken along the line VI-VI.
Figure 7:
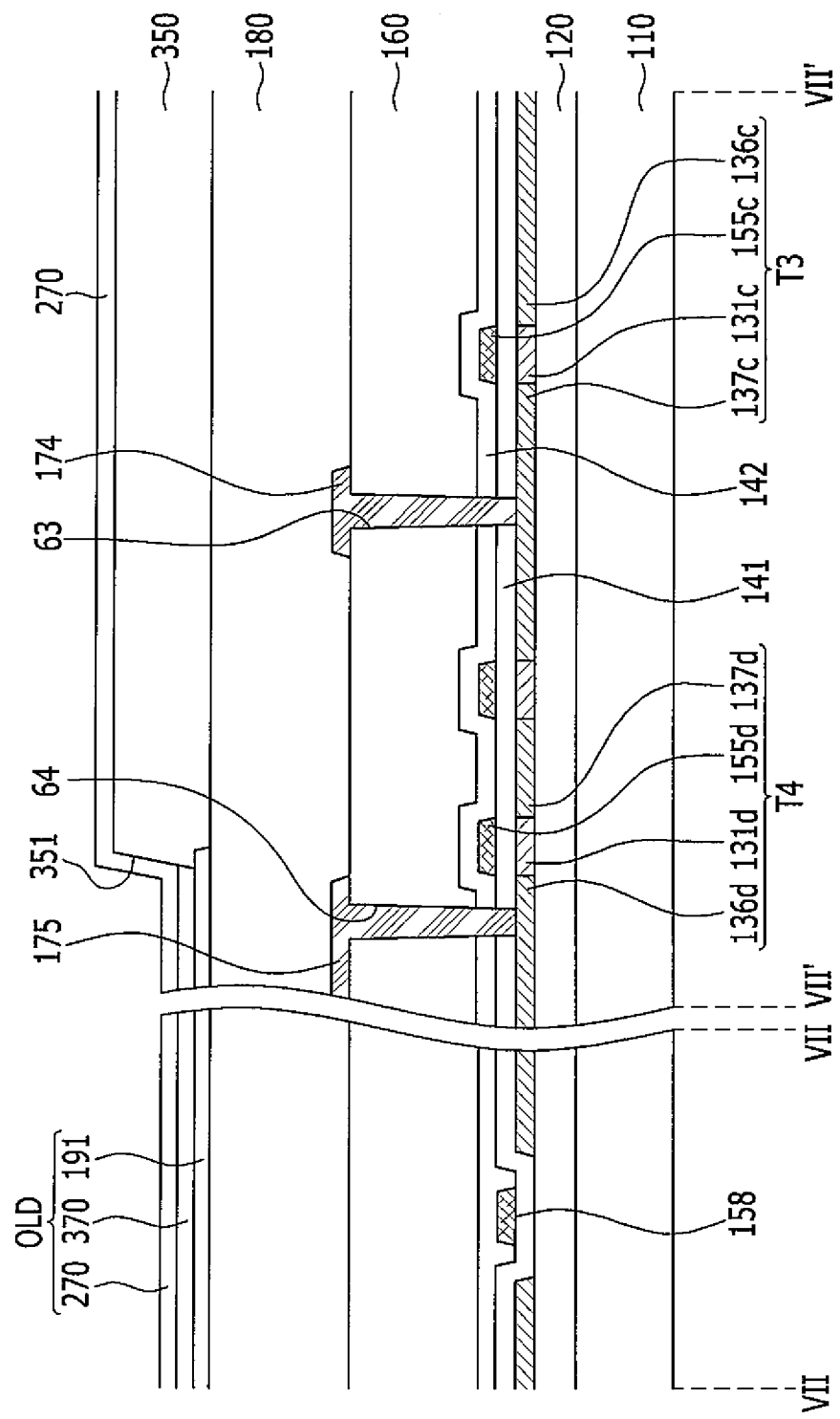
FIG. 7 is a cross-sectional view of the organic light emitting diode display of FIG. 5 taken along the lines VII-VII and VII'-VII'.

FIG. 4 is a schematic layout view of a transistor and a capacitor forming a red pixel, a green pixel, and a blue pixel of an organic light emitting diode display according to an exemplary embodiment of the present disclosure, FIG. 5 is a detailed layout view of the red pixel of FIG. 4, FIG. 6 is a cross-sectional view of the organic light emitting diode display of FIG. 5 taken along the line VI-VI, and FIG. 7 is a cross-sectional view of the organic light emitting diode display of FIG. 5 taken along the lines VII-VII and VII'-VII'.

Hereinafter, a detailed planar structure of the organic light emitting diode display according to the exemplary embodiment of the present disclosure will be described in more detail with reference to FIG. 4 and FIG. 5, and a detailed cross-sectional structure will be described in more detail with reference to FIG. 6 and FIG. 7.

First, as shown in FIG. 4 and FIG. 5, an organic light emitting diode display according to an exemplary embodiment of the present disclosure includes a scan line 151, a previous scan line 152, an emission control line 153, and a bypass control line 158 respectively transmitting a scan signal Sn, a previous scan signal Sn−1, an emission control signal EM, and a bypass signal BP and formed along a row direction. A data line 171 and a driving voltage line 172 crossing the scan line 151, the previous scan line 152, the emission control line 153, and the bypass control line 158 are also included, and a data signal Dm and a driving voltage ELVDD are respectively applied to the pixel PX. The initialization voltage Vint is transmitted from the initialization voltage line 192 through the initialization transistor T4 to the compensation transistor T3. The initialization voltage line 192 is formed while alternately having a straight portion and an oblique portion.

The driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLD are formed in the green pixel G among the pixels PX; and the driving transistor T1, the switching transistor T2, the compensation transistor T3, the initialization transistor T4, the operation control transistor T5, the light emission control transistor T6, the storage capacitor Cst, and the organic light emitting diode OLD are formed in the red pixel R and the blue pixel B among the pixels PX.

The organic light emitting diode (OLD) is made of a pixel electrode 191, an organic emission layer 370, and a common electrode 270. In this case, the compensation transistor T3 and the initialization transistor T4 are configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor 130 connected thereto, and the semiconductor 130 may be formed to be curved in various shapes. The semiconductor 130 may be made of a polycrystalline semiconductor material and/or an oxide semiconductor material. The oxide semiconductor material may include any one oxide based on titanium (Ti), hafnium (Hf), zirconium (Zr), aluminum (Al), tantalum (Ta), germanium (Ge), zinc (Zn), gallium (Ga), tin (Sn), or indium (In); and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indiumtin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is made of the oxide semiconductor material, a separate passivation layer for protecting the oxide semiconductor material, which is vulnerable to an external environment such as a high temperature, may be added.

The semiconductor 130 includes a channel which is doped with an N-type impurity or a P-type impurity, and a source doping part and a drain doping part which are formed at corresponding sides of the channel. The source doping part is doped with a doping impurity that is of an opposite type to the doping impurity doped on the channel. In the exemplary embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between the source electrodes and the drain electrodes of different transistors is doped and thus the source electrode and the drain electrode may be electrically connected to each other.

As illustrated in FIG. 5, the channel 131 includes a driving channel 131a formed in the drive transistor T1, a switching channel 131b formed, in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7. However, since the red pixel R and the blue pixel B do not include the bypass transistor T7, the bypass channel 131g is not formed in the red pixel R and the blue pixel B.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed to be elongated in a narrow space. Accordingly, a driving range of the gate voltage applied to the driving gate electrode 155a is increased by the elongated driving channel 131a. The driving range of the driving gate-source voltage Vgs means a difference between the maximum (or largest) driving gate-source voltage of the driving transistor corresponding to the maximum gray and the minimum (or smallest) driving gate-source voltage of the driving transistor corresponding to the minimum (or smallest) gray scale level or the difference between the driving gate-source voltages Vgs for each step for the gray scale level expression. Since the driving range of the gate voltage is increased, a gray scale level of light emitted from the organic light emitting diode OLD may be finely controlled by changing the magnitude of the gate voltage, and as a result, the resolution of the organic light emitting diode display device may be enhanced and display quality may be improved. Various example shapes such as 'reverse S', 'S', 'M', and 'W' may be implemented by variously modifying the shape of the driving channel 131a.

The driving gate electrode 155a overlaps with the driving channel 131a, and the driving source electrode 136a and the driving drain electrode 137a are formed at corresponding sides of the driving channel 131a to be close to each other. The driving gate electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b which is a part that extends downward from the scan line 121 overlaps with the switching channel 131b, and the switching source electrode 136b, and the switching drain electrode 137b are formed at corresponding sides of the switching channel 131b to be close to each other. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c. The compensation gate electrode 155c which is a part of the scan line 151 is formed as two electrodes to prevent a leakage current and overlaps the compensation channel 131c. The compensation source electrode 136c and the compensation drain electrode 137c are formed to be adjacent to respective sides of the compensation channel 131c. The compensation drain electrode 137c is connected to a first data connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d which is a part of the previous scan line 152 is formed as two electrodes to prevent the leakage current and overlaps the initialization channel 131d. The initialization source electrode 136d and the initialization drain electrode 137d are formed to be adjacent to respective sides of the initialization channel 131d. The initialization source electrode 136d is connected to a second data connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e which is a part of the light emission control line 153 overlaps the operation control channel 131e, and the operation control source electrode 136e and the operation control drain electrode 137e are formed to be adjacent to respective sides of the operation control channel 131e. The operation control source electrode 136e is connected to a part that extends from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f which is a part of the light emission control line 153 overlaps the light emission control channel 131f, and the light emission control source electrode 136f and the light emission control drain electrode 137f are formed to be adjacent to respective sides of the light emission control channel 131f. The light emission control drain electrode 137f is connected to a third data connecting member 179 through a contact hole 66.

The bypass transistor T7 formed in the green pixel (G) includes the bypass channel 131g, a bypass gate electrode 155g, a bypass source electrode 136g, and a bypass drain electrode 137g. The bypass gate electrode 155g which is a part of the bypass control line 158 overlaps the bypass channel 131g, and the bypass source electrode 136g and the bypass drain electrode 137g are formed to be adjacent to respective sides of the bypass channel 131g.

The bypass source electrode 136g is directly connected to the light emission control drain electrode 137f, and the bypass drain electrode 137g is directly connected to the initialization source electrode 136d of the adjacent green pixel (G).

However, the bypass transistor T7 is not formed in the red pixel (R) and the blue pixel (B). That is, the light emission control drain electrode 137f of the light emission control transistor T6 of the red pixel (R) and the initialization source electrode 136d of the initialization transistor T4 of the red pixel (R) are separated from each other, and the light emission control drain electrode 137f of the light emission control transistor T6 of the blue pixel (B) and the initialization source electrode 136d of the initialization transistor T4 of the blue pixel (B) are separated from each other. Accordingly, the semiconductor 130 and the bypass control line 158 do not overlap each other such that the bypass transistor T7 is not formed in the red pixel (R) and the blue pixel (B). In this case, the light emission control transistor T6 of the red pixel (R) and the initialization transistor T4 are separated from each other, and the light emission control transistor T6 of the blue pixel (B) and the initialization transistor T4 are separated from each other.

As described above, by forming the bypass transistor T7 in the green pixel (G) as the pixel having the largest effect on the black luminance, the correct black luminance image may be realized, thereby improving the contrast ratio. Also, by omitting the bypass transistor T7 in the red pixel (R) and the blue pixel (B) as a pixel having the smallest effect on the black luminance, a space in the pixel may be maximally ensured. Therefore, such pixels can be applied to high resolution structures, and a margin may be maximally ensured, thereby improving the yield.

One end of the driving channel 131a of the driving transistor T1 is connected to the switching drain electrode 137b and the operation control drain electrode 137e, and the other end of the driving channel 131a is connected to the compensation source electrode 136c and the emission control source electrode 136f.

The storage capacitor Cst includes the first storage electrode 155a and a second storage electrode 156 with a second insulating layer 142 therebetween. The first storage electrode 155a corresponds to the driving gate electrode 155a, and the second storage electrode 156 is a portion that extends from a storage line 157, occupies a larger area than the driving gate electrode 155a, and fully covers the driving gate electrode 155a.

Herein, the second insulating layer 142 is a dielectric material, and a storage capacitance is determined by charges stored in the storage capacitor Cst and a voltage between the two electrodes 155a and 156. As such, the driving gate electrode 155a is used as the first storage electrode 155a, and as a result, it is possible to ensure a space in which the storage capacitor may be formed within a space narrowed by the driving channel 131a has a large area in the pixel.

The first storage electrode 155a which is the driving gate electrode 155a is connected with one end of the first data connecting member 174 through the contact hole 61 and a storage opening 51. The storage opening 51 is an opening formed in the second storage electrode 156. Accordingly, the contact hole 61 connecting one end of the first data connecting member 174 and the driving gate electrode 155a is formed in the storage opening 51. The first data connecting member 174 is formed to be parallel to and at the same layer as the data line 171, and the other end of the first data connecting member 174 is connected to the compensation drain electrode 137c of the compensation transistor T3 and the initialization drain electrode 137d of the initialization transistor T4 through the contact hole 63. Accordingly, the first data connecting member 174 connects the driving gate electrode 155a, and the compensation drain electrode 137c of the compensation transistor T3, and the initialization drain electrode 137d of the initialization transistor T4, to each other.

The second storage electrode 156 is connected with the driving voltage line 172 through a contact hole 69.

Accordingly, the storage capacitor Cst stores a storage capacitance corresponding to a difference between the driving voltage ELVDD transferred to the second storage electrode 156 through the driving voltage line 172 and the gate voltage Vg of the driving gate electrode 155a.

The third data connection member 179 is connected with the pixel electrode 191 through a contact hole 81 and the second data connection member 175 is connected with the initialization voltage line 192 through a contact hole 82.

Hereinafter, cross-sectional structures of the organic light emitting diode display device according to the exemplary embodiment of the present disclosure will be described in detail according to a lamination order with reference to FIG. 6 and FIG. 7.

In this case, since a lamination structure of the operation control transistor T5 is mostly the same as that of the light emission control transistor T6, a detailed description thereof will be omitted.

A buffer layer 120 may be formed on a substrate 110. The substrate 110 may be formed of an insulating material such as glass, crystal, ceramic, or plastic, and the buffer layer 120 blocks impurities from the substrate 110 during a crystallization process for forming a polycrystalline semiconductor to serve to improve characteristics of the polycrystalline semiconductor and reduce stress applied to the substrate 110.

The semiconductor 130 including the channel 131 including the driving channel 131a, the switching channel 131b, the compensation channel 131c, the initialization channel 131d, the operation control channel 131e, the light emission control channel 131f, and the bypass channel 131g is formed on the buffer layer 120. A driving source electrode 136a and a driving drain electrode 137a are formed on respective sides of the driving channel 131a in the semiconductor 130, and a switching source electrode 136b and a switching drain electrode 137b are formed on respective sides of the switching channel 131b. The compensation source electrode 136c and the compensation drain electrode 137c are formed at both sides of the compensation channel 131c, and the initialization source electrode 136d and the initialization drain electrode 137d are formed at both sides of the initialization channel 131d. The operation control source electrode 136e and the operation control drain electrode 137e are formed at both sides of the operation control channel 131e, and the emission control source electrode 136f and the emission control drain electrode 137f are formed at both sides of the emission control channel 131f. The bypass source electrode 136g and the bypass drain electrode 137g are formed at respective sides of the bypass channel 131g.

In this case, the bypass channel 131g, the bypass source electrode 136g, and the bypass drain electrode 137g are not formed in the red pixel (R) and the blue pixel (B).

A first insulating layer 141 covering the semiconductor 130 is formed thereon. On the first gate insulating layer 141, first gate wires 151, 152, 153, 158, 155a, 155b, 155c, 155d, 155e, and 155f including the switching gate electrode 155b, a scan line 151 including the compensating gate electrode 155c, the previous scan line 152 including the initialization gate electrode 155d, the light emission control line 153 including the operation control gate electrode 155e and the light emission control gate electrode 155f, and the bypass control line 158 including the bypass gate electrode 155g and the driving gate electrode (the first storage electrode) 155a, are formed thereon.

The second gate insulating layer 142 covering the first gate wires 151, 152, 153, 158, 155a, 155b, 155c, 155d, 155e, and 155f and the first gate insulating layer 141, is formed thereon. The first gate insulating layer 141 and the second gate insulating layer 142 may be formed of a silicon nitride (SiNx) and/or a silicon oxide (SiOx).

Second gate wires 157 and 156 including the storage line 157 parallel to the scan line 151 and the second storage electrode 156 as a portion extending from the storage line 157 are formed on the second gate insulating layer 142.

The second storage electrode 156 is wider than the first storage electrode 155a functioning as the driving gate electrode such that the second storage electrode 156 covers the entire driving gate electrode 155a.

An interlayer insulating layer 160 is formed on the second gate insulating layer 142 and the second gate wires 157 and 156. The interlayer insulating layer 160 may be formed of a silicon nitride (SiNx) and/or a silicon oxide (SiOx).

The interlayer insulating layer 160 has contact holes 61, 62, 63, 64, 65, 66, and 69. Data wires 171, 172, 174, 175, and 179 including the data line 171, the driving voltage line 172, the first data connecting member 174, the second data connecting member 175, and the third data connecting member 179 are formed on the interlayer insulating layer 160.

The data line 171 is connected to the switching source electrode 136b through the contact hole 62 formed in the first gate insulating layer 141, the second gate insulating layer 142, and the interlayer insulating layer 160. One end of the first data connecting member 174 is connected to the first storage electrode 155a through the contact hole 61 formed in the second gate insulating layer 142 and the interlayer insulating layer 160, and the other end of the first data connecting member 174 is connected to the second compensation drain electrode 137c and the second initialization drain electrode 137d through the contact hole 63 formed in the first gate insulating layer 141, the second gate insulating layer 142, and the interlayer insulating layer 160.

The second data connecting member 175 parallel to the data line 171 is connected to the initialization source electrode 136d through the contact hole 64 formed in the first gate insulating layer 141, the second gate insulating layer 142, and the interlayer insulating layer 160. In addition, the third data connection member 179 is connected with the light emission control drain electrode 137f through the contact hole 66 formed in the first gate insulating layer 141, the second gate insulating layer 142, and the interlayer insulating layer 160.

The passivation layer 180 covers the data wires 171, 172, 174, 175, and 179, and the interlayer insulating layer 160 is formed thereon. The passivation layer 180 may be formed by an organic layer.

The pixel electrode 191 and the initialization voltage line 192 are formed on the passivation layer 180. The third data connection member 179 is connected with the pixel electrode 191 through a contact hole 81 formed on the passivation layer 180, and the second data connection member 175 is connected with the initialization voltage line 192 through a contact hole 82 formed in the passivation layer 180.

A pixel definition layer (PDL) 350 covering the passivation layer 180, the initialization voltage line 192, and the pixel electrode 191 is formed on edges of the passivation layer 180, the initialization voltage line 192, and the pixel electrode 191, and the pixel definition layer 350 has a pixel opening 351 that exposes the pixel electrode 191. The pixel definition layer 350 may be made of resins such as a polyacrylate resin and a polyimide, and/or silica-series inorganic materials.

An organic emission layer 370 is formed on the pixel electrode 191 exposed by the pixel opening 351, and a common electrode 270 is formed on the organic emission layer 370. The common electrode 270 is formed on the pixel definition layer 350 to be formed through the plurality of pixels. As such, an organic light emitting diode OLD is formed, which includes the pixel electrode 191, the organic emission layer 370, and the common electrode 270.

Herein, the pixel electrode 191 is an anode which is a hole injection electrode and the common electrode 270 is a cathode which is an electron injection electrode. However, the exemplary embodiment according to the present disclosure is not necessarily limited thereto, and the pixel electrode 191 may be the cathode and the common electrode 270 may be the anode according to a driving method of the display device. When holes and electrons are injected into the organic emission layer 370 from the pixel electrode 191 and the common electrode 270, respectively, and the excitons generated through combination of the injected holes and electrons fall from an excited state to a ground state, light is emitted.

The organic emission layer 370 is made of a low-molecular organic material and/or a high-molecular organic material such as poly(3,4-ethylenedioxythiophene) (PEDOT). Further, the organic emission layer 370 may be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is on the pixel electrode 191 which is the positive electrode, and the hole transporting layer; the emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. According to another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described according to another example may be formed by one organic emission layer, and may even include a configuration that may emit white light by laminating a plurality of organic emission layers. According to an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and/or the like.

An encapsulation member for protecting the organic light emitting diode OLD may be formed on the common electrode 270, and the encapsulation member may be sealed to the substrate 100 by a sealant and may be formed of various materials such as glass, quartz, ceramic, plastic, and/or a metal. On the other hand, a thin film encapsulation layer may be formed on the common electrode 270 by depositing the inorganic layer and the organic layer with the sealant.

In some embodiments, in the exemplary embodiment, the bypass transistor is only formed in the green pixel having the largest effect on the black luminance; however, the bypass transistor may be formed in two pixels having the large effect on the black luminance to improve the contrast ratio as another exemplary embodiment.

The organic light emitting diode display according to another exemplary embodiment of the present disclosure will be described with reference to FIG. 8.

Figure 8:
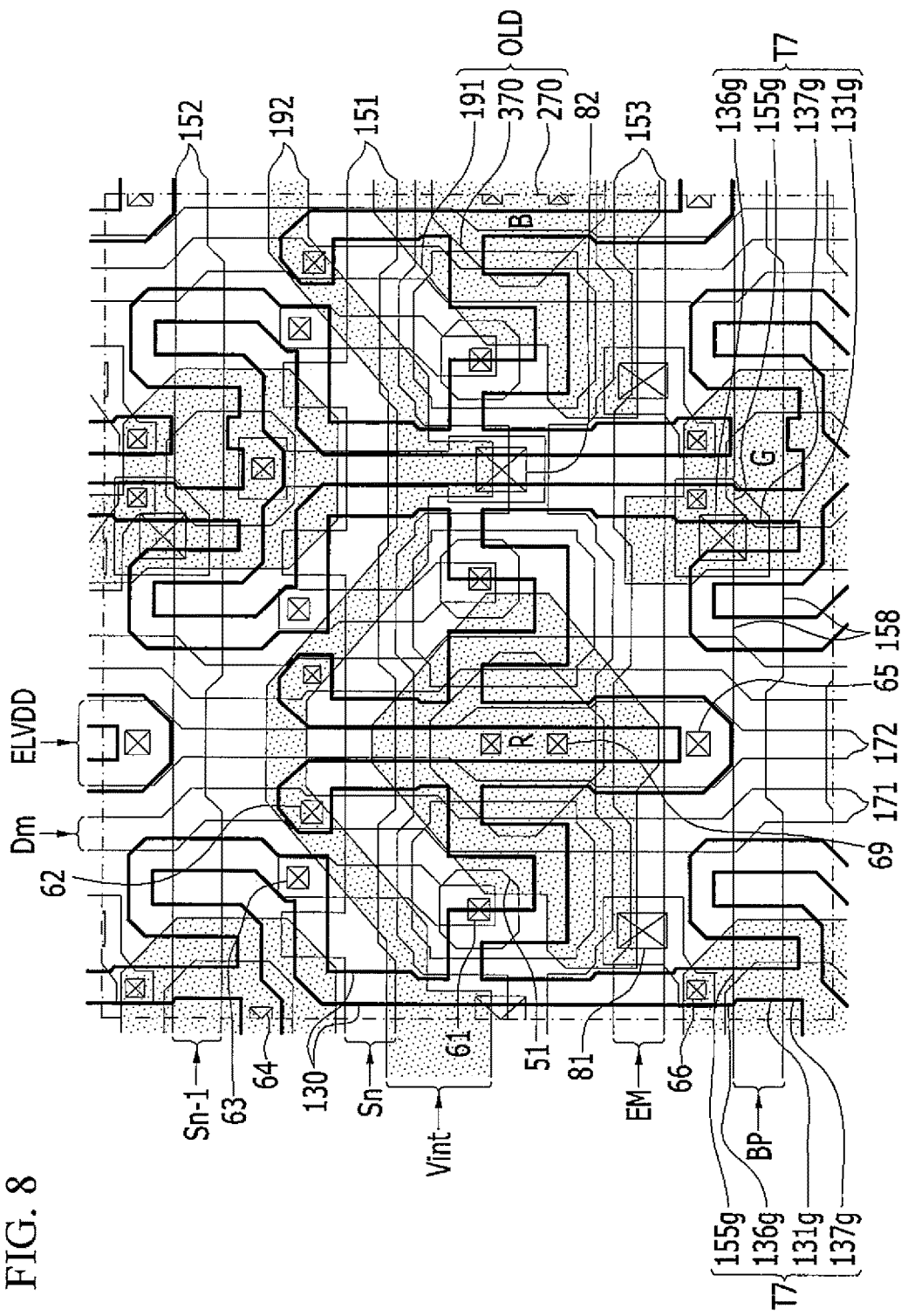
FIG. 8 is a layout view of a transistor and a capacitor forming a red pixel, a green pixel, and a blue pixel of an organic light emitting diode display according to an exemplary embodiment of the present disclosure.

FIG. 8 is a layout view of a transistor and a capacitor forming a red pixel, a green pixel, and a blue pixel of an organic light emitting diode display according to an exemplary embodiment of the present disclosure.

The exemplary embodiment shown in FIG. 8 is substantially the same as an exemplary embodiment shown in FIG. 1, FIG. 2, FIG. 3, FIG. 4, FIG. 5, FIG. 6, and FIG. 7 except for the bypass transistor formed in the red pixel such that the repeated description is omitted.

As shown in FIG. 8, bypass transistors T7 formed in the red pixel (R) and the green pixel (G) of the organic light emitting diode display according to an exemplary embodiment of the present disclosure include the bypass channel 131g, the bypass gate electrode 155g, the bypass source electrode 136g, and the bypass drain electrode 137g. The bypass gate electrode 155g which is a part of the bypass control line 158 overlaps with the bypass channel 131g, and the bypass source electrode 136g and the bypass drain electrode 137g are formed at respective sides of the bypass channel 131g to be close to each other.

The bypass source electrode 136g of the red pixel is directly connected to the light emission control drain electrode 137f, and the bypass drain electrode 137g of the red pixel (R) is directly connected to the initialization source electrode 136d of the adjacent red pixel (R). The bypass source electrode 136g of the green pixel is directly connected to the light emission control drain electrode 137f, and the bypass drain electrode 137g of the green pixel is directly connected to the initialization source electrode 136d of the adjacent green pixel.

However, the bypass transistor T7 is not formed in the blue pixel (B). That is, the light emission control drain electrode 137f of the light emission control transistor T6 of the blue pixel (B) and the initialization source electrode 136d of the initialization transistor T4 of the blue pixel (B) are separated from each other. Accordingly, the semiconductor 130 and the bypass control line 158 do not overlap each other in the blue pixel (B) such that the bypass transistor T7 is not formed. In this case, the light emission control transistor T6 and the initialization transistor T4 of the blue pixel (B) are separated from each other.

As described above, by forming the bypass transistor T7 in the red pixel (R) and the green pixel (G) as the pixel having the largest effect on the black luminance, the correct black luminance image may be realized, thereby further improving the contrast ratio. By omitting the bypass transistor T7 in the blue pixel (B) as the pixel having the smallest effect on the black luminance, the space in the pixel may be maximally ensured. Therefore, such pixels can be applied to a high resolution structure, and the margin may be maximally ensured, thereby improving the yield.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims and their equivalents.

DESCRIPTION OF SOME OF THE SYMBOLS

| | |
|---|---|
| 131a: driving channel | 132b: switching channel |
| 141: first gate insulating layer | 142: second gate insulating layer |
| 151: scan line | 152: previous scan line |
| 153: light emission control line | 158: bypass control line |
| 155a: driving gate electrode | 155b: switching gate electrode |
| 156: second storage electrode | 157: storage line |
| 160: interlayer insulating layer | 171: data line |
| 172: driving voltage line | 174: first data connecting member |
| 175: second data connecting member | 179: third data connecting member |
| 180: passivation layer | 191: pixel electrode |
| 192: initialization voltage line | 270: common electrode |
| 350: pixel definition layer | 370: organic emission layer |

What is claimed is:

1. An organic light emitting diode display comprising:
   a substrate;
   a plurality of scan lines and a plurality of light emission control lines on the substrate, and configured to transmit a scan signal and a light emission control signal, respectively;
   a plurality of data lines and a plurality of driving voltage lines crossing the scan lines and the light emission control lines, and configured to transmit a data voltage and a driving voltage, respectively; and
   a plurality of pixels comprising a first pixel, a second pixel, and a third pixel, and connected to the plurality of scan lines and the plurality of data lines,
   wherein each of the pixels comprises:
      a switching transistor connected to a corresponding one of the scan lines and a corresponding one of the data lines;
      a driving transistor connected to the switching transistor;

an organic light emitting diode connected to the driving transistor;
a light emission control transistor between the driving transistor and the organic light emitting diode, and configured to be turned on by the light emission control signal;
an initialization transistor configured to transmit an initialization voltage to a driving gate electrode of the driving transistor,
wherein at least one pixel from among the first pixel, the second pixel, and the third pixel, further comprises a bypass transistor between the initialization transistor and the light emission control transistor and configured to bypass a portion of a driving current transmitted by the driving transistor, and
wherein the plurality of pixels comprise a red pixel, a green pixel, and a blue pixel, and the bypass transistor is only in the green pixel.

2. The organic light emitting diode display of claim 1, wherein
the driving transistor comprises:
a driving channel on the substrate,
a driving gate electrode overlapping the driving channel, and
a driving source electrode and a driving drain electrode at respective sides of the driving channel,
wherein the driving channel is curved on a plane.

3. The organic light emitting diode display of claim 2, further comprising:
a storage capacitor comprising:
a first storage electrode at a same layer as the corresponding one of the scan lines and overlapping the driving channel; and
a second storage electrode overlapping the first storage electrode and located on the first storage electrode,
wherein the first storage electrode is a driving gate electrode of the driving transistor.

4. The organic light emitting diode display of claim 1, wherein
the organic light emitting diode comprises:
a pixel electrode electrically connected to the driving transistor,
an organic emission layer on the pixel electrode, and
a common electrode on the organic emission layer.

5. An organic light emitting diode display comprising:
a substrate;
a plurality of scan lines and a plurality of light emission control lines on the substrate, and configured to transmit a scan signal and a light emission control signal, respectively;
a plurality of data lines and a plurality of driving voltage lines crossing the scan lines and the light emission control lines, and configured to transmit a data voltage and a driving voltage, respectively;
a plurality of previous scan lines and a plurality of bypass control lines on the substrate, and configured to transmit a previous scan signal and a bypass control signal, respectively; and
a plurality of pixels comprising a first pixel, a second pixel, and a third pixel, and connected to the plurality of scan lines and the plurality of data lines,
wherein each of the pixels comprises:
a switching transistor connected to a corresponding one of the scan lines and a corresponding one of the data lines;
a driving transistor connected to the switching transistor;
an organic light emitting diode connected to the driving transistor;
a light emission control transistor between the driving transistor and the organic light emitting diode, and configured to be turned on by the light emission control signal; and
an initialization transistor configured to be turned on according to the previous scan signal to transmit an initialization voltage to a driving gate electrode of the driving transistor,
wherein at least one pixel from among the first pixel, the second pixel, and the third pixel, further comprises a bypass transistor between the initialization transistor and the light emission control transistor, configured to bypass a portion of a driving current transmitted by the driving transistor, and configured to be turned on by the bypass control signal.

6. The organic light emitting diode display of claim 5, wherein
the bypass transistor comprises:
a bypass channel on the substrate;
a bypass gate electrode overlapping the bypass channel; and
a bypass source electrode and a bypass drain electrode at respective sides of the bypass channel,
wherein the bypass source electrode is directly connected to a light emission control drain electrode of the light emission control transistor, and the bypass drain electrode is directly connected to an initialization source electrode of the initialization transistor of an adjacent one of the pixels.

7. The organic light emitting diode display of claim 6, wherein
the bypass gate electrode is a portion overlapping the bypass channel of a corresponding one of the bypass control lines.

8. The organic light emitting diode display of claim 6, wherein
the bypass transistor is in one pixel having a largest effect on a black luminance, from among the first pixel, the second pixel, and the third pixel.

9. The organic light emitting diode display of claim 8, wherein
the first pixel, the second pixel, and the third pixel, comprise a red pixel, a green pixel, and a blue pixel, respectively, and
the bypass transistor is in the green pixel.

10. The organic light emitting diode display of claim 9, wherein
the light emission control transistor and the initialization transistor of the red pixel are separated from each other, and
the light emission control transistor and the initialization transistor of the blue pixel are separated from each other.

11. The organic light emitting diode display of claim 10, wherein
the light emission control drain electrode of the light emission control transistor of the red pixel and the initialization source electrode of the initialization transistor are separated from each other, and
the light emission control drain electrode of the light emission control transistor of the blue pixel and the initialization source electrode of the initialization transistor are separated from each other.

12. The organic light emitting diode display of claim 6, wherein the bypass transistor is in two pixels having a largest effect on a black luminance, from among the first pixel, the second pixel, and the third pixel.

13. The organic light emitting diode display of claim 12, wherein the first pixel, the second pixel, and the third pixel, comprise a red pixel, a green pixel, and a blue pixel, respectively, and the bypass transistor is in the green pixel and the red pixel.

14. The organic light emitting diode display of claim 13, wherein the light emission control transistor and the initialization transistor of the blue pixel are separated from each other.

15. The organic light emitting diode display of claim 14, wherein the light emission control drain electrode of the light emission control transistor of the blue pixel and the initialization source electrode of the initialization transistor are separated from each other.

* * * * *